June 24, 1969 F. M. D'HEURLE ET AL 3,451,912

SCHOTTKY-BARRIER DIODE FORMED BY SPUTTER-DEPOSITION PROCESSES

Filed July 15, 1966

INVENTORS
FRANÇOIS M. d'HEURLE
LEO ESAKI
HAJIME SEKI

BY S. P. Tedesco

ATTORNEY

United States Patent Office 3,451,912
Patented June 24, 1969

3,451,912
SCHOTTKY-BARRIER DIODE FORMED BY SPUTTER-DEPOSITION PROCESSES

Francois M. D'Heurle, Ossining, Leo Esaki, Chappaqua, and Hajime Seki, Yorktown Heights, N.Y., assignors to International Business Machines Corporation, Armonk, N.Y., a corporation of New York Filed July 15, 1966, Ser. No. 565,517
Int. Cl. C23c *15/00;* H01l *5/00*
U.S. Cl. 204—192 17 Claims

ABSTRACT OF THE DISCLOSURE

Schottky-barrier diodes are fabricated by sputter-deposition processes to substantially eliminate contamination at the metal-semiconductor junction to achieve reproducible device characteristics and to obtain large area contacts whereby the current-carry capacity of such diodes is substantially increased.

This invention relates to Schottky-barrier diodes and in particular, to Schottky-barrier diodes formed by sputter-deposition processes so as to exhibit reproducible characteristics.

A Schottky-barrier diode, hereinafter referred to as a barrier diode, is defined by a metal-semiconductor junction and exhibits rectifying properties due to the difference in the respective work functions of the contacting metallic layer and semiconductor body. Accordingly, the metal-semiconductor junction exhibits a contact potential difference, or potential barrier, which must be overcome to support conduction. In operation, barrier diodes exhibit unilateral conduction characteristics similar to those exhibited by pn semiconductor diodes.

Since minority carrier storage at the metal-semiconductor junction is very small, barrier diodes exhibit very short reverse recovery times, i.e. higher speeds, than pn semiconductor diodes and, hence, are desirable for many industrial applications. At the present time, however, barrier diodes are not extensively employed in industry. As the pn semiconductor diodes are readily available and present day fabrication techniques provide reproducible characteristics, the development and utilization of barrier diodes for industrial applications has not progressed rapidly. The use of barrier diodes has been limited, particularly for high power applications, since present day fabrication techniques are incapable of providing large area metal-semiconductor junctions and, also, reproducible characteristics, e.g. threshold voltage $V_T$, series resistance $R_S$, etc. For example, while threshold voltage $V_T$ is limited primarily by the difference in the respective work functions of the thin metallic layer and the semiconductor body, there has been a definite lack of correlation therebetween and the operating characteristics of the barrier diode. This lack of correlation appears due, in part, to the presence of a contaminating layer of foreign material, e.g. adsorbed species, surface reaction products, etc., on the surface of the semiconductor body which renders it difficult to reproduce the potential barrier at the metal-semiconductor junction. The presence of such contaminating layer, which can be one or more monolayers thick, prevents intimate contact between the metallic layer and the semiconductor body whereby the potential barrier at the junction thereof varies in erratic fashion. Techniques employed in the prior art to eliminate such contaminating layer at the metal-semiconductor junction and produce barrier diodes having reproducible characteristics have proven unwieldy and difficult.

Accordingly, it is an object of this invention to provide practical barrier diodes having reproducible and reliable characteristics.

It is another object of this invention to provide reproducible barrier diodes having low power loss.

It is another object of this invention to provide a barrier diode having a low series resistance $R_S$.

It is another object of this invention to provide a barrier diode capable of rectifying very high currents at very low applied voltages.

It is another object of this invention to provide a large area metal-semiconductor junction having good mechanical and electrical properties.

It is another object of this invention to provide very high speed barrier diodes.

It is another object of this invention to fabricate barrier diodes by sputter-deposition processes such that the contaminating layer at the metal-semiconductor junction is substantially totally eliminated and the potential barrier at such junction is substantially reduced.

These and other objects and advantages of this invention are achieved by employing a bias sputter-deposition process to deposit a metallic layer onto the surface of a semiconductor body. A sputter-deposition process, for example, has been described in "Thin Films Deposited by Bias Sputtering" by L. I. Maissel et al., Journal of Applied Physics, vol. 3, No. 1, January 1965. In accordance with the particular aspects of this invention, the semiconductor body having a chemically polished and cleaned surface is positioned within a sputtering chamber along with a metallic target, which is sputtered to form the metallic layer. Regardless of the care exercised in chemically polishing and cleaning the surface of the semiconductor body, a contaminating layer is present thereon due to exposure, for example, to certain reactive gases present in the atmosphere and, also, within the sputtering chamber. During the sputter-deposition process, the semiconductor body, or substrate, is biased to a negative potential whereby the surface is bombarded by high energy ions of the sputtering gas.

In accordance with the described mechanism, the sputtered metallic ions have sufficient energy, e.g. 10 ev.–20 ev., to penetrate through the contaminating layer but insufficient energy to penetrate into the surface of the semiconductor body. The energy of the sputtered metallic ions is much greater than that attained during evaporation or vapor-deposition processes, e.g. 1 ev. Accordingly, the sputtered metallic ions deposited in intimate contact with the surface of the semiconductor body and the potential barrier at the metal-semiconductor junction is substantially reduced. Concurrently, ions of the sputtering gas present in the plasma and falling within the field of the biased semiconductor body are accelerated toward the surface of such body and acquire sufficient energy, e.g. 100 ev.–120 ev., to "sputter off" the contaminating layer concurrently with the deposition of the metallic layer. Advantageously, such ions do not possess sufficient energy to 'sputter off" the metallic layer during the deposition process. The result is that the contaminating layer is effectively removed and the metallic layer is deposited in intimate contact with the surface of the semiconductor body. Accordingly, the potential barrier at the metal-semiconductor junction is substantially determined by the respective work functions of the metallic layer and the semiconductor body whereby reproducible characteristics are achieved.

Additional advantages are derived by fabricating barrier diodes by sputter-deposition processes. For example, the adhesion of the metallic layer is substantially improved, since it is in intimate contact with the surface of the semiconductor body whereby large area metal-semiconductor junctions can be deposited to increase current-carrying capacity. Due to the dynamics of the sputter-deposition system, adhesion is substantially improved, since the ions incident on the surface of the semiconductor body have sufficient energy to form an adhesive-type layer, e.g. metal-silicide, at the metal-semiconductor junction. Accordingly, larger area metal-semiconductor junctions can be formed having uniform and good mechanical and electrical properties whereby the current-carrying capacity of the barrier diodes is very substantially increased. The areas of the metal-semiconductor junctions which are obtained by sputter-deposition processes are several orders of magnitude greater than obtained by prior art techniques. Also, to reduce series resistance, the semiconductor body can be formed as a very thin epitaxial layer on a highly doped, or degenerate, semiconductor wafer of same conductivity type whereby ideal characteristics are more nearly approached. Accordingly, barrier diodes fabricated in accordance with this invention exhibit minimal low forward voltage drops and very large current handling capacities.

The foregoing and other objects, features and advantages of the invention will be apparent from the following more particular description of preferred embodiments of the invention, as illustrated in the accompanying drawings.

Figures 1, 2, 3, 4:
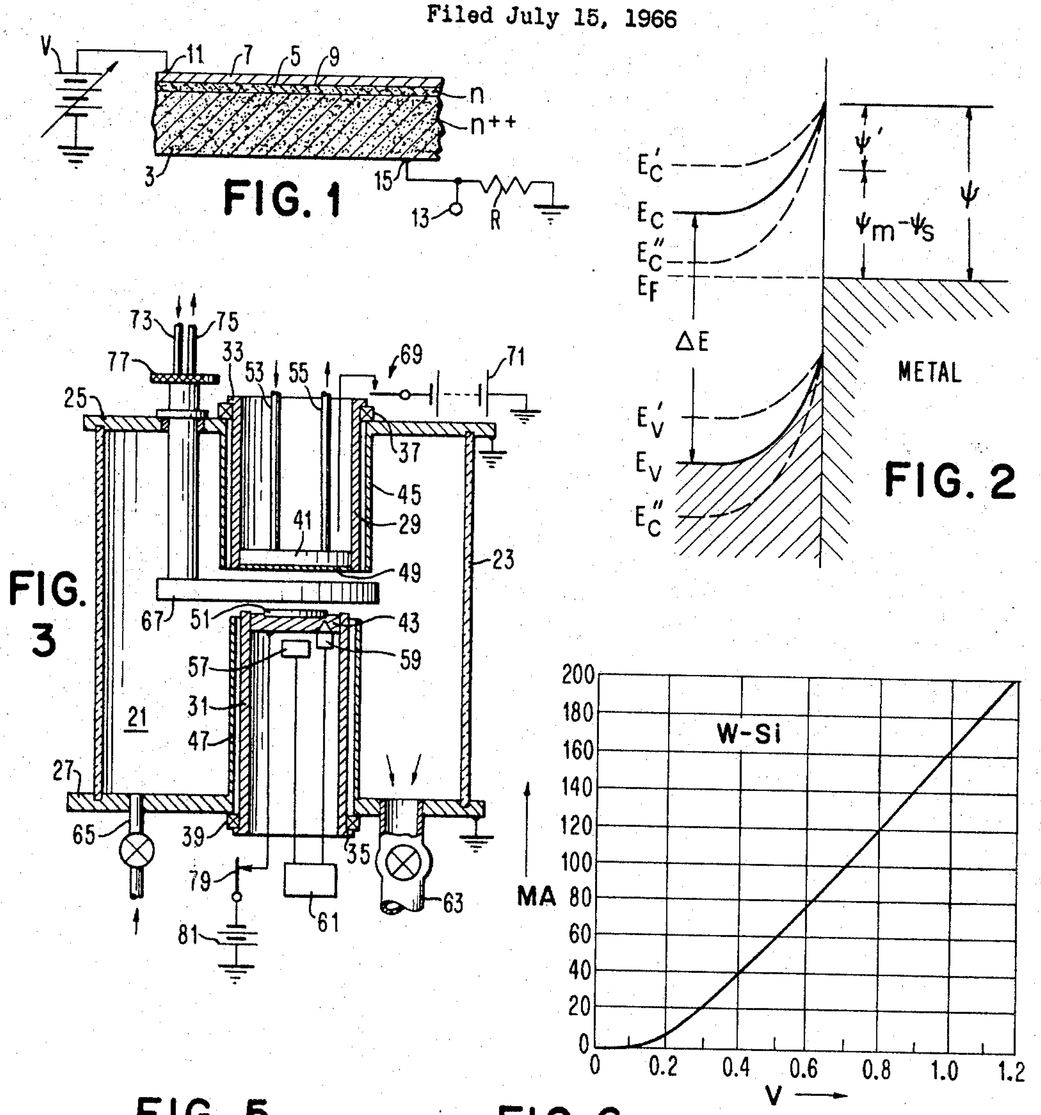
FIG. 1 is a cross sectional view of a barrier diode in accordance with the present invention.
FIG. 2 is an energy-band diagram at the metal-semiconductor junction of the barrier diode of FIG. 1.
FIG. 3 is a cross sectional view of an apparatus for fabricating barrier diodes by a sputter-deposition process.
Figure 5:
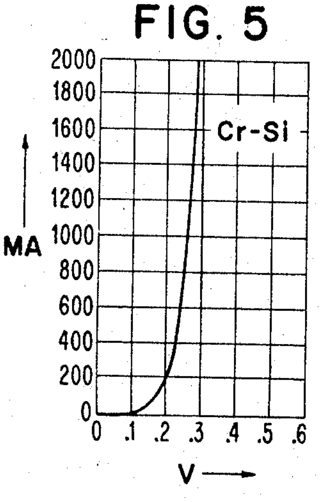
Figure 6:
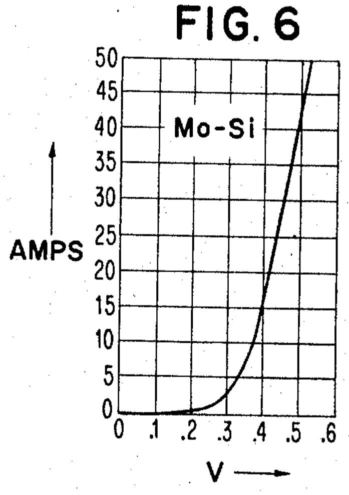

FIGS. 4, 5, and 6 illustrate the current-voltage characteristics of tungsten-silicon, chromium-silicon, and molybdenum-silicon barrier diodes fabricated by sputter-deposition processes.

Referring to FIG. 1, a Schottky-barrier diode is shown in cross section as comprising a body 1, including a wafer 3 of $n^{++}$-type semiconductor material and an epitaxial layer 5 of n-type semiconductor material. Epitaxial layer 5 can be formed by a vapor-growth, or disproportionation reaction, process as described, for example, in the J. C. Marinace Patent 3,014,820, issued on Dec. 29, 1961, and the J. C. Marinace Patent 3,089,794, issued on May 14, 1963, each patent being assigned to a common assignee. Also, a metallic layer 7 is formed in intimate contact with the surface of layer 5 by a sputter-deposition process, hereinafter described. As layer 5 and metallic layer 7 exhibit different work functions $\psi_s$ and $\psi_m$, respectively, junction 9 defined therebetween exhibits rectifying properties when body 1 and metallic layer 7 are appropriately biased. According to accepted theory, a contact potential $\psi$ appears at junction 9 which depends upon the difference in the respective work functions $\psi_s$ and $\psi_m$ of layer 5 and metallic layer 7, the electron affinity of the semiconductor material defining layer 5, and the distribution of surface states at junction 9. The potential barrier $\psi$ at junction 9 is modulated by voltage sourve V connected to metallic layer 7 at contact 11 and an output is derived at output terminal 13 across load resistor R connected to wafer 3 at ohmic contact 15.

In the prior art, barrier diodes have been formed by other than sputter-deposition techniques, for example, by electroplating, jet plating, pyrolytic deposition, evaporation, etc. of a metallic layer onto the surface of a semiconductor body. Reference may be had to "Rectification Properties of Metal Semiconductor Contacts" by E. H. Borneman et al., Journal of Applied Physics, vol. 26, page 1021, August 1955 for a discussion of electroplating metallic contacts onto germanium surfaces; "Rectification Properties of Metal-Silicon Contacts" by E. C. Wurst, Jr. et al., Journal of Applied Physics, vol. 28, No. 2, pages 235 through 240, February 1957 for a discussion of jet plating metallic contacts onto silicon surfaces; "Tungsten-Semiconductor Schottky-Barrier Diodes" by C. R. Crowell et al., Transactions of the Metallurgical Society of Aime, vol. 23, March 1965, pages 478 through 481, for a discussion of the pyrolytic deposition of tungsten films onto germanium, silicon, and gallium arsenide surfaces; and "Conduction Properties of the Au-n-Type-Si Schottky-Barrier" by D. Kahng, Solid State Electronics, Pergamon Press, vol. 6, 1963, pages 281 through 295 for a discussion of the characteristics of gold contacts formed by evaporation onto a silicon (Si) surface. While numerous techniques have been employed to fabricate barrier diodes of the type shown in FIG. 1, such diodes have relatively small junction areas and are exclusively for high speed, low power applications. Reproducible operating characteristics for high power applications have not been achieved due to poor electrical, as well as mechanical, contact resulting from the presence of a contaminating layer at the metal-semiconductor junction. The presence of such contaminating layer varies the potential barrier $\psi$ at the metal-semiconductor junction such that threshold voltage $V_T$ is not reproducible and, generally, is in excess of theoretical predictions; also, such contaminating layer increases the series resistance $R_S$ of the barrier diode. In prior art techniques, great effort has been exercised to eliminate the contaminating layer from the semiconductor surface to achieve reproducible barrier diode characteristics. Such effort, however, has not proven satisfactory, since the semiconductor surface is necessarily exposed for short periods of time to reactive gases which formed surface reaction products having a thickness of one or more monolayers. For example, brief exposure of a silicon surface to air or to oxygen ($O_2$) or water vapor ($H_2O$) present in most fabrication systems forms a thin layer of silicon monoxide (SiO) or silicon dioxide ($SiO_2$) over such surface; also, organic materials, e.g. diffusion pump oil present in an evaporation system, may be adsorbed on the silicon surface.

The operation of the barrier diode of FIG. 1 and, also, the effects of a contaminating layer at junction 9 may be understood by reference to FIG. 2 which illustrates the energy band diagram at equilibrium of n-type semiconductor layer 5, e.g. silicon (Si), germanium (Ge), gallium arsenide (GaAs), etc., in contact with layer 7 formed of a high work function metal, e.g. molybdenum (Mo), tungsten (W), chromium (Cr), etc. It is evident to those skilled in the art that when body 1 is formed of p-type semiconductor material whereby current is supported by the movement of holes, a low work function metal, e.g. aluminum (Al), tin (Sn), zinc (Zn), indium (In), etc., is employed to effect rectification. The energy levels at the top and the bottom of the valence and conduction bands of layer 5 are indicated by $E_v$ and $E_c$, respectively, and are separated by a forbidden region of energy levels indicated by $\Delta E$. At equilibrium, the respective Fermi levels $E_F$ in layer 5 and metallic layer 7 are established at corresponding energy levels. When metallic layer 7 is biased positively, i.e. in a forward direction, or negatively, i.e. in a reverse direction, with respect to body 1, the energy bands of layer 5 of n-type semiconductor material are displaced upwardly and downwardly, respectively, as indicated by the dashed lines. The surface of layer 5 is normally depleted as indicated by an upward bending of the energy bands at junction 9, the depletion region extending to a depth in the order of $10^{-6}$ cm. to $10^{-4}$ cm. In effect, this depletion region defines a high resistance between layer 5 and metallic layer 7, which define the cathode and anode, respectively, of the barrier diode. Since the work functions $\psi_s$ and $\psi_m$ of layer 5 and metallic layer 7, respectively, are unequal, the potential barrier $\psi$ at junction 9 is given theoretically by the expression $(\psi_m - \psi_s)$. Disregarding series resistance $R_S$, the potential barrier $\psi$ at junction 9 determines the threshold voltage $V_T$ of the barrier diode at which substantial current is obtained. The presence of a contaminating layer of varying thickness and, also, the presence of surface states, for example, dangling bonds, etc., at junction 9, however may vary the potential barrier $\psi$ by a factor $\psi'$, as illustrated, and, hence, vary the threshold voltage $V_T$. Elimination of any contaminating layer, or foreign material, at the junction 9 causes the potential barrier $\psi$ to more nearly approach the theoretical limit whereby reproducible threshold voltages $V_T$ are achieved.

When low magnitudes of forward voltage V are applied across layer 5 and metallic layer 7 of FIG. 1, most of the voltage drop occurs across the high resistance depletion region and modulates the carrier, or electron, concentration therein. Accordingly, the potential barrier at junction 9 seen by electrons in metallic layer 7 is reduced and the energy bands of layer 5 are displaced upwardly as indicated by $E_{c'}$ and $E_{v'}$. When the potential barrier at junction 9 is reduced sufficiently, i.e. at near threshold voltage $V_T$, electrons in metallic layer 7 have sufficient energy to overcome, i.e. tunnel through, the reduced potential barrier and travel across junction 9. As the applied forward voltage V is increased, the flow of electrons across junction 9 increases exponentially as given by the expression $I=I_0(e^{qV'/kT}-1)$, where $I_0$ is a multiplication factor related to the junction area, $q$ is the electronic charge, V' is the voltage applied across junction 9, $k$ is Boltzmann's constant, and T is absolute temperature.

Conversely, when a reverse bias voltage V is applied across layer 5 and metallic layer 7, the barrier energy $\psi$ under reverse bias conditions is given by the expression $(\psi_m-\psi_s+\psi')$. Accordingly, the barrier diode of FIG. 1 exhibits unilateral conduction characteristics similar to those exhibited by semiconductor diode devices.

Since the barrier energy $\psi$ at the metal-semiconductor junction 9 is related to the work functions $\psi_m$ and $\psi_s$ of metallic layer 7 and layer 5, the threshold voltage $V_T$ can be more precisely determined by proper selection of the constituent materials when any contaminating layer, or other foreign material, at junction 9 is eliminated. In accordance with particular aspects of this invention, such contaminating layer is substantially eliminated to achieve more reproducible characteristics and to obtain a large-area junction 9 when semiconductor metallic layer 7 is formed by biased sputter-deposition processes. An exemplary sputtering apparatus is illustrated in FIG. 3 as comprising a chamber 21 defined by cylindrical glass member 23 received in appropriate recesses defined in grounded annular members 25 and 27. Cathode and anode fingers 29 and 31, for example, defined by stainless steel tubes, extend into chamber 21 through openings in annular members 25 and 27, respectively. Cathode and anode fingers 29 and 31 include outwardly extending flanges 33 and 35, respectively, which are pressed onto insulating collars 37 and 39, respectively. The opposite ends of cathode and anode fingers 29 and 31 are sealed by brazed-on copper discs 41 and 43, respectively, which are supported in opposing-spaced relationship, e.g. approximately 2 inches. Chamber 21, thus defined, is capable of maintaining low pressures, e.g. in the order of $10^{-6}$ torr.

Cathode and anode fingers 29 and 31 are surrounded by grounded aluminum shields 45 and 47, respectively, which effectively limit the glow discharge between opposing surfaces of discs 41 and 43. A thin sheet 49 of target material, e.g. tungsten, chromium, molybdenum, etc., of which metallic layer 7 of FIG. 1 is to be formed is soldered or brazed onto disc 41; also, a substrate 51, i.e. body 1 of FIG. 1 formed of silicon, germanium, gallium arsenide, etc., is conventionally mounted on disc 43. Target 49 is water-cooled during the sputtering process, for example, along plastic input and output tubes 53 and 55 coiled within disc 41. In addition, substrate 51 can be heated prior to and during the sputtering process by an appropriate heater unit 57, e.g. a cartridge-type heater, located adjacent disc 43. Also, a shielded thermocouple 59 is provided which is connected to a properly isolated galvanometer-type temperature controller 61 for regulating heater unit 57 to maintain substrate 51 at a desired temperature, e.g. 300° C., during the sputtering process.

Chamber 21 is initially evacuated along valved exhaust duct 63 which is connected to a high efficiency vacuum pump system, not shown, capable of reducing pressure at least below $10^{-6}$ torr. Also, chamber 21 is connected to a source of sputtering gas, e.g. argon, along valved input duct 65. During the initial evacuation of chamber 21 and prior to the introduction of sputtering gas along input duct 65, chamber 21 is degassed by conventional techniques. When the system has been degassed and evacuated, exhaust duct 63 is throttled and an argon partial pressure sufficient to maintain a glow discharge, e.g. $20\mu$–$50\mu$, is introduced into chamber 21 along input duct 65. With shutter 67 positioned as shown, target 49 is biased, for example, at 5 kv., by closing switch 69 to connect voltage source 71 and a glow discharge is struck to condition the surface of target 51, i.e. surface contaminants are removed, so as to insure reproducibility of metallic layer 7. Preferably, shutter 67 is cooled by water circulating along input and output tubes 73 and 75. When target 49 has been conditioned, substrate 51 is biased, say, at −100 v., by closing switch 79 to connect voltage source 81. The shutter element 67 is then displaced from between target 49 and substrate 51 by means of an external knob 77 whereby metallic ions sputtered from the target are free to diffuse within chamber 21 and deposit over the exposed surface of substrate 51, i.e. over layer 7 to form metallic layer 7. Also, substrate 51, since biased, is subjected to bombardment by high energy positive argon ions present in the plasma.

The described sputter-deposition process is continued for a time sufficient to deposit a continuous metallic layer 7 of uniform thickness, e.g. 10,000 A.–50,000 A., over layer 5. When metallic layer 7 has been deposited, switches 69 and 79 are opened to unbias target 49 and substrate 51, and anode finger 31 is removed from chamber 21 to allow access to the barrier diode structure.

The effect of the sputter-deposition process is twofold. Firstly, metallic ions sputtered from target 49 have sufficient energy, e.g. 10 ev.–20 ev., to penetrate the one or more monolayers of foreign material which may have formed over substrate 51. Accordingly, the sputtered metallic ions pass through such monolayers of foreign material and deposit as metallic layer 7 in intimate contact with the surface of substrate 51, i.e. layer 7 of FIG. 1. Also, metallic layer 7 exhibits a strong bonding with the surface of substrate 51, i.e. layer 5 of FIG. 1, than would be expected so as to allow for the deposition of a larger metal-semiconductor junction 9 than allowable by prior art techniques. It appears that the metallic ions impinging on the surface of substrate 51 possess sufficient energy to form a metallic compound with the substrate material which increases the bonding therebetween and has minimal effect, if any, on the potential barrier $\psi$. Concurrently, the surface of substrate 51 is subjected to bombardment by argon ions which have sufficient energy, e.g. 100 ev., to "sputter off" the contaminating layer but insufficient energy to "sputter off" the deposited metallic ions whereby the resulting metallic layer 7 is in good mechanical and electrical contact throughout with layer 5 as shown in FIG. 1. Accordingly, the barrier diode of FIG. 1 exhibits a potential barrier $\psi$ at junction 9 which more nearly approaches the theoretical limit $(\psi_m-\psi_s)$ whereby the threshold voltage $V_T$ is reproducible and, also, a large current carrying capacity due to the large area of junction 9.

In addition, the provision of highly-doped wafer 3 provides a low series resistance $R_S$ whereby the forward current I per unit of applied forward voltage in excess of the threshold voltage $V_T$ is increased. When the series resistance $R_S$ is reduced, a larger portion of the voltage V applied across body 1 and metallic layer 7 is dropped across the junction 9. For example, the voltage V' applied across junction 9 is given by the expression $(V-IR_S)$ and, accordingly, forward current through the barrier diode of FIG. 1 is given by $I=I_0(e^{q(V-IR_S)/kT}-1)$. It is evident, therefore, that the current-voltage characteristics of the barrier diode can be determined by controlling the doping of wafer 3, such characteristics approaching the ideal when wafer 3 is highly doped.

Exemplary current-voltage characteristic curves tungsten-silicon, chromium-silicon, and molybdenum-silicon barrier diodes formed by processes hereinabove described are illustrated in FIGS. 4, 5, and 6, respectively. During the sputter-deposition process, the argon partial pressure within chamber 21 was maintained at approximately $30\mu$; voltage and current supplied to target 49 were 4 kv. and 150 ma., respectively; voltage and current supplied to substrate 51 were − 110 v. and 45 ma., respectively, and the temperature of substrate 51 maintained at 300° C. The barrier diodes thus formed exhibit threshold voltages $V_T$ which are as low as might be occasionally obtained by prior art techniques and reproducible due to the substantial elimination of any contaminating layer at junction 9. For example, FIG. 4 illustrates the current-voltage characteristics of a non-epitaxial barrier diode comprising a thin metallic layer of tungsten having dimensions of .016" x .016" and formed on an n-type semiconductor body having a 1 ohm-cm. resistivity throughout. While such diode exhibits a very low forward voltage drop, the rate of current increase with increasing magnitudes of applied voltage V is relatively small, series resistance $R_S$ being large due to the bulk resistivity of the semiconductor body. The effects of reduced series resistance $R_S$ in a barrier diode comprising an epitaxial semiconductor layer formed on a degenerate wafer, as described with respect to FIG. 1, are illustrated by a comparison of FIG. 4 with FIGS. 5 and 6. FIGS. 5 and 6 illustrate the current-voltage characteristics of chromium-silicon and molybdenum-silicon epitaxial barrier diodes, respectively, wherein the metallic layer has dimensions of .100" x .100" and is formed over an n-type epitaxial silicon layer supported on an n-type degenerate silicon wafer. In such structures, the series resistance $R_S$ is reduced to the order of approximately .003 ohm by the use of epitaxial techniques and results primarily from the bulk resistivity of the semiconductor body. As shown in FIG. 6, the threshold voltage $V_T$ of the molybdenum-silicon barrier diode is in the order of .35 volt. Due to the reduced series resistance $R_S$, the rate of current increase with increasing applied voltage V is very substantially increased. For example, as shown in FIG. 5, current through the chromium-silicon epitaxial barrier diode can be varied between completely off and in excess of 2,000 ma. when applied voltage V is varied between .1 volt and .3 volt; more significantly, current through the molybdenum-silicon epitaxial barrier diode can be varied between completely off and in excess of 50 amps when applied voltage V is varied between .1 volt and .52 volt.

While the invention has been particularly shown and described with reference to preferred embodiments thereof, it will be understood by those skilled in the art that various changes in form and details may be made therein without departing from the spirit and scope of the invention.

What is claimed is:

1. The process of forming a low voltage barrier diode including a semiconductor body and a metallic layer forming an intimate contact with at least one surface of said semiconductor body comprising the steps of:

positioning a non-degenerate semiconductor body along with a metallic body in a chamber containing a sputtering atmosphere;

selecting said semiconductor body and said metallic body to have different work functions so as to provide a potential barrier when forming an intimate contact therebetween;

sputtering portions of said metallic body to deposit as a thin metallic layer in intimate contact with at least one surface of said semiconductor body to minimize said potential barrier and improve adhesion at said intimate contact; and providing contacts to said semiconductor body and said thin metallic layer for ohmically connecting a voltage source of sufficient magnitude to overcome said potential barrier and support current flow across said intimate contact.

2. The process for forming a low voltage barrier diode as defined in claim 1 comprising the further steps of:

forming said semiconductor body of n-type material; and forming said metallic body of a material selected from the group consisting of tungsten, chromium, and molybdenum.

3. The process for forming a low voltage barrier diode as defined in claim 1 comprising the further steps of:

forming said semiconductor body of p-type material; and forming said metallic body of material selected from the group consisting of aluminum, zinc, indium, and tin.

4. The process for forming a low voltage barrier diode as defined in claim 1 comprising the further steps of:

forming said semiconductor body of n-type material; and forming said metallic body of material having a larger work function than said n-type material.

5. The process for forming a low voltage barrier diode as defined in claim 1 comprising the further steps of:

forming said semiconductor body of p-type material; and forming said metallic body of a material having a smaller work function than said p-type material.

6. The process for forming a low voltage barrier diode as defined in claim 1 comprising the further step of:

forming said semiconductor body of a material selected from the group consisting of silicon, germanium, and gallium arsenide.

7. The process of forming a low voltage barrier diode including a semiconductor body and a metallic layer forming an intimate contact with at least one surface of said semiconductor body comprising the steps of:

positioning a non-degenerate semiconductor and a metallic body in a chamber containing a sputtering atmosphere;

selecting said semiconductor body and said metallic body to have different work functions so as to provide a potential barrier when forming an intimate contact therebetween;

biasing said metallic body to produce a glow discharge in said chamber, portions of said metallic body being sputtered and diffusing within said chamber to deposit as a thin metallic layer over at least one surface of said semiconductor body, said glow discharge containing ions of said sputtering atmosphere;

biasing said semiconductor body during deposition of said metallic layer, ions of said sputtering gas being accelerated toward and bombarding said one surface of said semiconductor body with sufficient energy to eliminate foreign material from said one surface of said semiconductor body and reduce said potential barrier at the intimate contact between said one surface of said semiconductor body and said metallic layer; and providing contacts to said semiconductor body and said metallic layer for ohmically connecting a voltage source of sufficient magnitude to overcome said potential barrier and support current flow across said intimate contact.

8. The process of forming a low voltage barrier diode as defined in claim 7 including the further steps of:

forming said semiconductor body of n-type material having a first work function; and forming said metallic body of a material having a second work function larger than said first work function.

9. The process of forming a low voltage barrier diode as defined in claim 7 including the further steps of:
forming said semiconductor body of p-type material having a first work function; and
forming said metallic body of a material having a second work function less than said first work function.

10. The process of forming a low voltage barrier diode as defined in claim 7 including the further step of:
heating said semiconductor body during deposition of said metallic layer.

11. The process of forming a low voltage barrier diode comprising the steps of:
positioning a non-degenerate semiconductor body and a metallic target in a chamber containing a sputtering atmosphere, said semiconductor body normally having a contaminating layer formed over the surfaces thereof;
selecting said semiconductor body and said metallic target to have different work functions;
biasing said metallic target to produce a glow discharge in said chamber, portions of said metallic target being sputtered and diffusing within said chamber to deposit as a thin metallic layer over at least one surface of said semiconductor body;
biasing said semiconductor body during deposition of said metallic layer to cause ions present in said sputtering atmosphere to impinge upon said one surface of said semiconductor body with sufficient energy to sputter off said contaminating layer and with insufficient energy to sputter off said metallic layer being deposited so as to minimize the potential barrier and improve adhesion at the junction between said metallic layer and said one surface of said semiconductor body; and
providing contacts to said semiconductor body and said metallic layer for ohmically connecting a voltage source of sufficient magnitude to overcome said potential barrier and support current flow across said junction.

12. The process of forming a low voltage barrier diode comprising the steps of:
epitaxially depositing a thin non-degenerate semiconductor layer onto a lower-resistivity semiconductor substrate of same conductivity type;
positioning said semiconductor substrate and a metallic target within a chamber containing a sputtering atmosphere;
selecting the respective materials of said epitaxial layer and said metallic target to have different work functions;
biasing said metallic target to produce a glow discharge, portions of said metallic target being sputtered and diffusing within said chamber to deposit as a metallic layer over the surface of said epitaxial layer;
biasing said substrate during deposition of said metallic layer to cause ions present in said glow discharge to be accelerated toward and bombard said surface of said epitaxial layer to reduce the potential barrier at the junction therebetween and said metallic layer; and
providing contacts to said substrate and said metallic layer of ohmically connecting a voltage source of sufficient magnitude to overcome said potential barrier and support current flow across said junction between said metallic layer and said epitaxial layer.

13. The process of forming a low voltage barrier diode as defined in claim 12 comprising the further step of:
forming said thin semiconductor layer and said semiconductor substrate of a same conductivity-type material selected from the group consisting of silicon, germanium, and gallium arsenide.

14. The process of forming a low voltage barrier diode as defined in claim 12 comprising the further steps of:
forming said thin semiconductor layer and said semiconductor substrate of an n-type material; and
forming said metallic target of a material selected from the group consisting of tungsten, chromium, and molybdenum.

15. The process of forming a low voltage barrier diode as defined in claim 12 comprising the further steps of:
forming said thin semiconductor layer and said semiconductor substrate of p-type material; and
forming said metallic target of a material selected from the group consisting of aluminum, tin, zinc, and indium.

16. The process of forming a low voltage barrier diode as defined in claim 12 comprising the further steps of:
forming said thin semiconductor layer of n-type material having a first work function; and
forming said metallic target of a material having a second work function greater than said first work function.

17. The process of forming a low voltage barrier diode as defined in claim 12 comprising the further steps of:
forming said thin semiconductor layer of p-type material having a first work function; and
forming said metallic target of a second material having a second work function less than said first work function.

References Cited

UNITED STATES PATENTS

| | | | |
|---|---|---|---|
| 3,021,271 | 2/1962 | Wehner | 204—192 |
| 3,329,601 | 7/1967 | Mattox | 204—298 |
| 3,349,297 | 10/1967 | Crowell et al. | 317—234 |

OTHER REFERENCES

I.B.M. Tech. Disc Bulletin: vol. 9, No. 1, p. 102, June 1966—"Field Effect Transistor" by D. DeWitt.

JAMES W. LAWRENCE, *Primary Examiner.*
R. SANDLER, *Assistant Examiner.*

U.S. Cl. X.R.

317—234